United States Patent [19]
Pearson

[11] Patent Number: 5,541,687
[45] Date of Patent: Jul. 30, 1996

[54] ELECTRONIC FLASH ASSEMBLAGE WITH REFLECTOR TO CIRCUIT BOARD CONNECTION

[75] Inventor: Douglas H. Pearson, Rochester, N.Y.

[73] Assignee: Eastman Kodak Company, Rochester, N.Y.

[21] Appl. No.: 368,174

[22] Filed: Jan. 3, 1995

[51] Int. Cl.[6] ................................................ G03B 15/03
[52] U.S. Cl. .......................................................... 354/145.1
[58] Field of Search ............................ 354/145.1, 149.11

[56] References Cited

U.S. PATENT DOCUMENTS 3,484,597  12/1969  Schmidt ................................ 240/1.3
4,570,203   2/1986  Daniels et al. ........................ 362/16
5,047,792   9/1991  Asano et al. .
5,170,199  12/1992  Nakai et al. ......................... 354/126

*Primary Examiner*—Monroe H. Hayes
*Attorney, Agent, or Firm*—Roger A. Fields

[57] ABSTRACT

An electronic flash assemblage comprising a circuit board having an exposed electrically conductive patch, and an electrically conductive flash reflector adapted to be attached to the circuit board, is characterized in that the flash reflector has a resilient electrically conductive extension which protrudes from the flash reflector to cause it to be deformed against the conductive patch when the flash reflector is attached to the circuit board, whereby the resilient extension will be inherently biased against the conductive patch to make an electrical connection between the conductive patch and the flash reflector.

4 Claims, 2 Drawing Sheets

ELECTRONIC FLASH ASSEMBLAGE WITH REFLECTOR TO CIRCUIT BOARD CONNECTION

FIELD OF THE INVENTION

The invention relates generally to the field of photography, and in particular to an electronic flash assemblage for a camera.

BACKGROUND OF THE INVENTION

Most modern electronic flash units use a triggering electrode method of flash firing. In this type of circuit, a main capacitor is connected permanently across two terminals of a glass flash tube filled with inert xenon gas. The resistance of the gas in the flash tube is normally too high to permit a direct discharge. For firing the flash unit there is a third electrode—for example, a coil of wire wound around the outside of the flash tube. An instantaneous triggering voltage of about 5000 volts applied to the coil of wire ionizes the gas in the tube, thus lowering the resistance of the gas and allowing the main capacitor to discharge its energy through the tube in the form of a intense flash of light. The triggering voltage is usually supplied by a trigger or ignition coil connected to a small capacitor.

Instead of winding the coil of wire around the outside of the flash tube, the tube can be supported with its outside directly against the inner wall of an electrically conductive flash reflector that is connected to the trigger coil as mentioned in U.S. Pat. No. 3,484,597, issued Dec. 16, 1969, and U.S. Pat. No. 4,570,203, issued Feb. 11, 1986. In this instance, the flash reflector serves as a light reflector and as a triggering electrode. Typically, a piece of wire or metal tape has one end soldered to a circuit board, which includes the trigger coil, and another end secured to the flash reflector. Ways are continuously being devised to simplify manufacture and design of the flash unit.

SUMMARY OF THE INVENTION

According to the invention, an electronic flash assemblage comprising a circuit board having an exposed electrically conductive patch, and an electrically conductive flash reflector adapted to be attached to the circuit board, is characterized in that:

the flash reflector has a resilient electrically conductive extension which protrudes from the flash reflector to cause it to be deformed against the conductive patch when the flash reflector is attached to the circuit board, whereby the resilient extension will be inherently biased against the conductive patch to make an electrical connection between the conductive patch and the flash reflector. Thus, a simpler arrangement without the need for soldering as in the prior art is achieved.

DETAILED DESCRIPTION OF THE INVENTION

The invention is disclosed as being embodied preferably in an electronic flash unit for a camera. Because the features of an electronic flash unit are generally known, the description which follows is directed in particular only to those elements forming part of or cooperating directly with the disclosed embodiment. It is to be understood, however, that other elements may take various forms known to a person of ordinary skill in the art.

Figure 1:
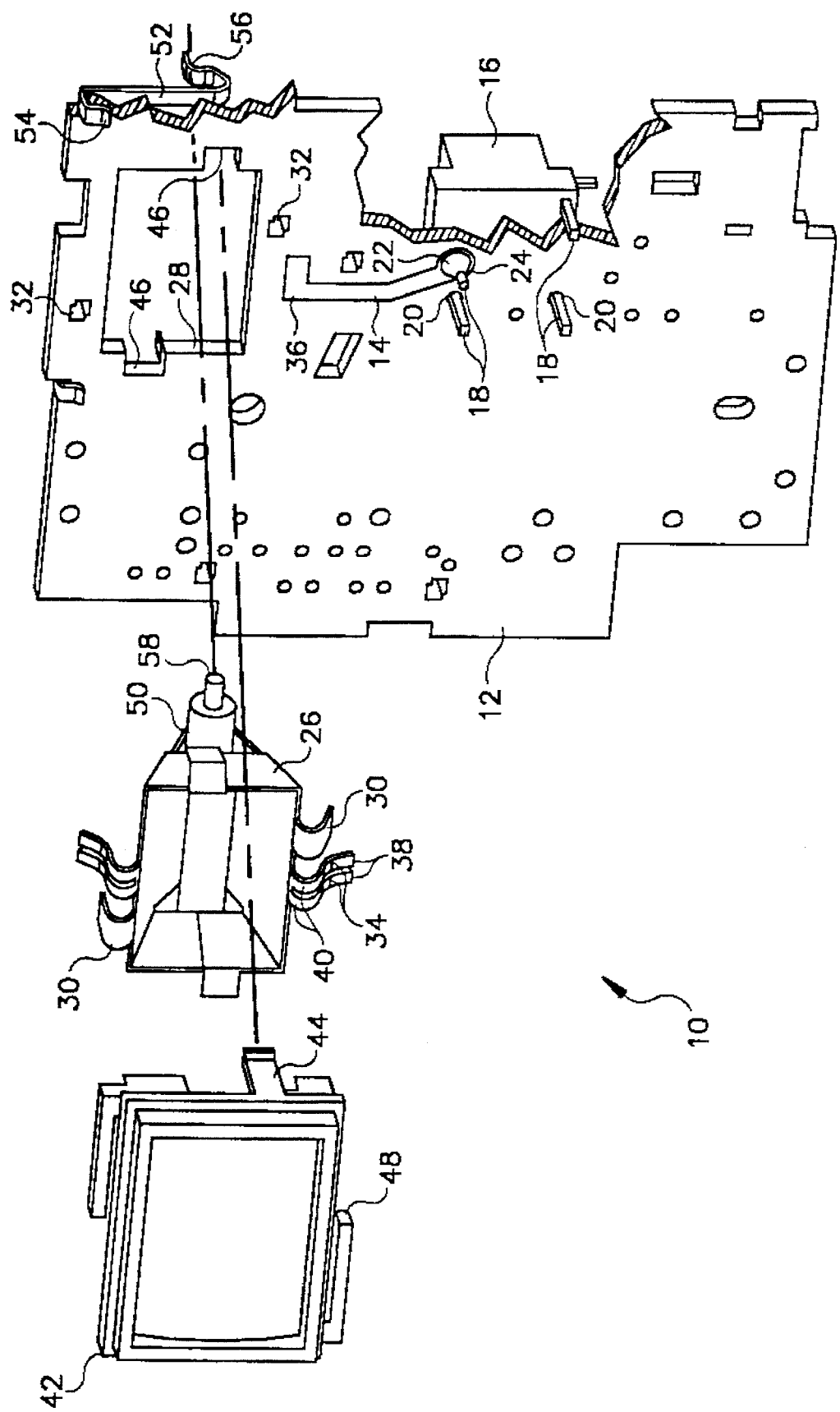
FIG. 1 is an exploded perspective view of an electronic flash unit according to a preferred embodiment of the invention, showing the flash unit partially disassembled.
Figure 2:
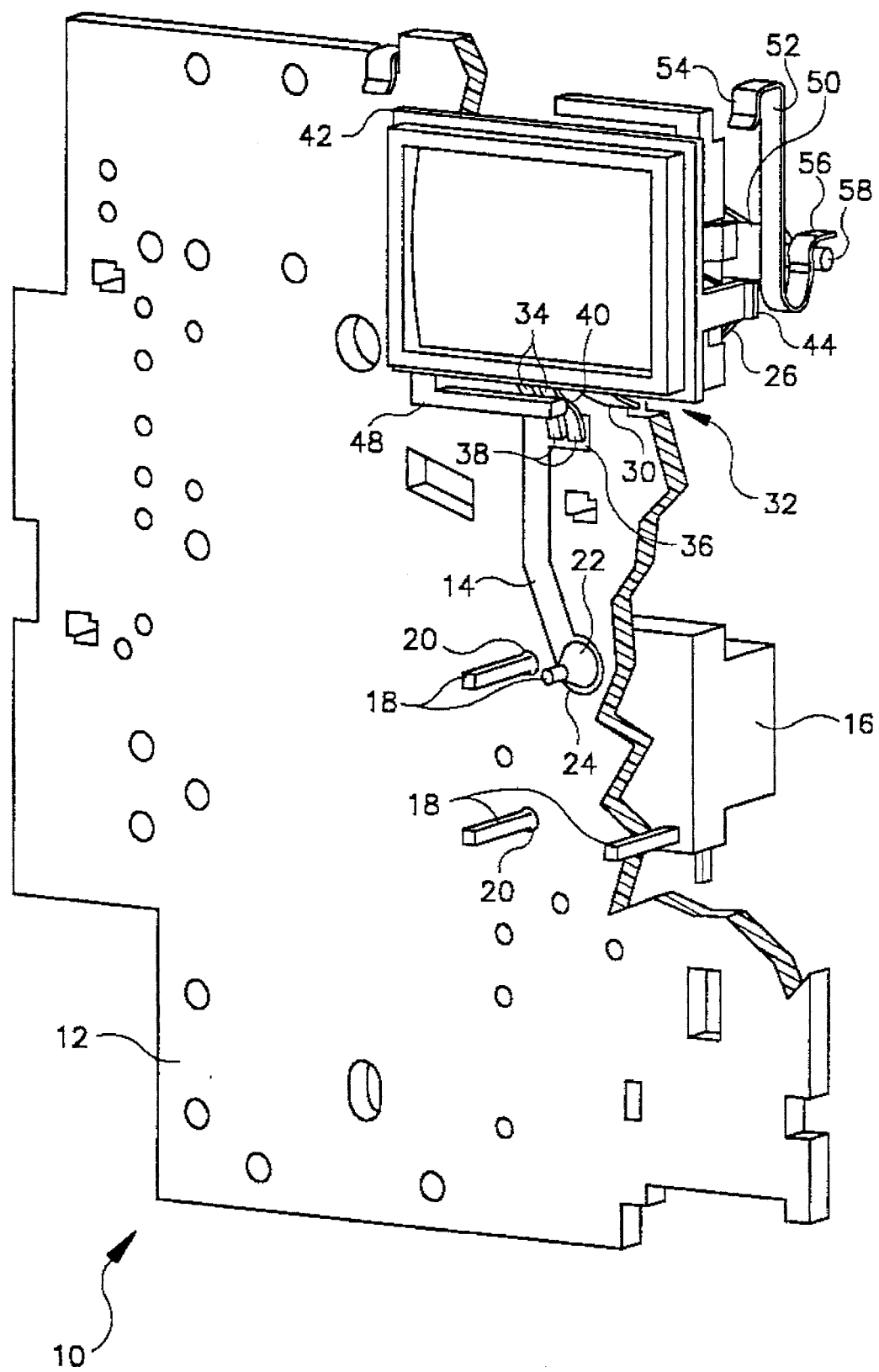
FIG. 2 is an assembled perspective view of the flash unit.

Referring now to FIGS. 1 and 2 of the drawings, an electronic flash assemblage 10 is shown to have several components that can be assembled to form a flash unit. A printed circuit board 12 has an electrically conductive patch which is an exposed metal strip 14. A known trigger or ignition coil 16 has four identical mounting pins 18 which are intended to be inserted through four corresponding pin-holes 20 in the circuit board 12 and to be held fast by respective solder caps 22, to attach the trigger coil to the circuit board. One of the solder caps 22 is located on one end 24 of the metal strip 14 to electrically connect the trigger coil 16 to the metal strip. An electrically conductive flash reflector 26 is intended to be placed in a rectangular opening 28 in the circuit board 12 and a pair of integral hooks 30 of the flash reflector fit into respective holes 32 in the circuit board, to attach the flash reflector to the circuit board. The flash reflector 26 has a pair of resilient, i.e. springy, electrically conductive, integral extensions 34 which protrude from the flash reflector to cause them to be deformed against another end 36 of the metal strip 14 when the flash reflector is attached to the circuit board 12. See FIG. 2. Thus, the pair of resilient extensions 34 will be inherently biased or urged against the end 36 of the metal strip 14 to make an electrical connection to that end without the need for soldering. Preferably, the pair of resilient extensions 34 have respective flat contact ends 38 and respective curved flexure (deformable) joints 40.

A transparent flash cover 42 is intended to be placed over the flash reflector 26, and attached to the circuit board 12 by inserting a pair of integral hooks 44 of the flash cover into respective cut-outs 46 in the circuit board. See FIGS. 1 and 2. An integral resilient finger 48 of the flash cover 42 is adapted to firmly press the contact ends 38 of the resilient extensions 34 firmly against the end 36 of the metal strip 14 as shown in FIG. 2.

After the flash reflector 26 is attached to the circuit board 12, a known glass flash tube 50 filled with inert xenon gas is positioned with its outside directly against an inner concave side of the flash reflector as shown in FIG. 2. A pair of resilient electrically conductive supports 52 each have one end 54 soldered to the circuit board 12 and another end 56 soldered to respective terminals or leads 58 of the flash tube 50. The ends 54 are electrically connected to a main capacitor, not shown, and the ends 56 serve to urge the flash tube 50 into intimate contact with the inner concave side of the flash reflector 26.

The invention has been described with reference to a preferred embodiment. However, it will be appreciated that variations and modifications can be effected by a person of ordinary skill in the art without departing from the scope of the invention.

PARTS LIST 10. flash assemblage
12. circuit board
14. metal strip
16. trigger coil
18. mounting pins
20. pin-holes
22. solder cap 24. strip end
26. flash reflector
28. rectangular opening
30. hooks
32. holes
34. resilient extensions
36. strip end
38. contact ends
40. flexure joints
42. flash cover
44. hooks
46. cut-outs
48. resilient finger
50. flash tube
52. resilient supports
54. support end
56. support ends
58. terminals

I claim:

1. An electronic flash assemblage comprising a circuit board having an exposed electrically conductive patch, and an electrically conductive flash reflector adapted to be attached to said circuit board, is characterized in that:

said flash reflector has an integral resilient electrically conductive extension which protrudes from the flash reflector to cause it to be substantially deformed against said conductive patch when the flash reflector is attached to said circuit board, in order that said resilient extension is inherently biased against said conductive patch to make an electrical connection between the conductive patch and the flash reflector; and a reflector cover for said flash reflector includes pressing means for firmly pressing said resilient extension against said conductive patch.

2. An electronic flash assemblage as recited in claim 1, further characterized by:

a flash tube supported to position its outside in intimate contact with said flash reflector; and a trigger coil electrically connected to said conductive patch to provide a triggering voltage to said flash reflector via said resilient extension to ionize a gas in said flash tube.

3. A method of assembling an electronic flash assemblage, comprising:

attaching an electrically conductive flash reflector to a circuit board in a way that substantially deforms an integral springy electrically conductive extension of the flash reflector against an exposed electrically conductive patch on the circuit board, in order that the resilient extension is inherently biased against the conductive patch to make an electrical connection between the conductive patch and the flash reflector; and attaching a reflector cover to the flash reflector, and positioning pressing means of the reflector cover to press the resilient extension against the conductive patch.

4. A method of assembling an electronic flash assemblage as recited in claim 3, further comprising:

positioning the outside of a flash tube in intimate contact with the flash reflector; and electrically connecting a trigger coil to the conductive patch.

* * * * *